United States Patent [19]
Meisburger et al.

[11] Patent Number: 5,502,306
[45] Date of Patent: Mar. 26, 1996

[54] ELECTRON BEAM INSPECTION SYSTEM AND METHOD

[75] Inventors: Dan Meisburger, San Jose; Alan D. Brodie, Palo Alto; Curt Chadwick, Los Gatos; Anil Desai, San Jose; Hans Dohse, Pleasanton; Dennis Emge, San Jose; John Greene, Los Altos; Ralph Johnson, Los Gatos; Ming-Yie Ling, Sunnyvale; John McMurtry, Menlo Park; Barry Becker, San Jose; Ray Paul, Palo Alto; Mike Robinson, San Jose; Richard Simmons, Los Altos; David E. A. Smith, San Mateo; John Taylor, San Jose; Lee Veneklasen, Castro Valley, all of Calif.; Dean Walters, Napierville, Ill.; Paul Wieczorek, San Jose, Calif.; Sam Wong, San Jose, Calif.; April Dutta, Milpitas, Calif.; Surendra Lele, Santa Clara, Calif.; Kirkwood Rough, San Jose, Calif.; Henry Pearce-Percy, Los Gatos, Calif.; Jack Y. Jau, Fremont, Calif.; Chun C. Lin, Cupertino, Calif.; Hoi T. Nguyen, Milpitas, Calif.; Yen-Jen Oyang, Cupertino, Calif.; Timothy L. Hutcheson, Los Gatos, Calif.; David J. Clark, Atherton, Calif.; Chung-Shih Pan, Palo Alto, Calif.; Chetana Bhaskar, San Jose, Calif.; Chris Kirk, Beconsfield Bucks, England; Eric Munro, London, England; John Gibilisco, Boulder, Colo.; Paul Sandland, Springfield, Oreg.

[73] Assignee: KLA Instruments Corporation, San Jose, Calif.

[21] Appl. No.: 214,377

[22] Filed: Mar. 17, 1994

(Under 37 CFR 1.47)

Related U.S. Application Data

[63] Continuation of Ser. No. 710,351, May 30, 1991, abandoned.

[51] Int. Cl.$^6$ ............................................. H01J 37/26
[52] U.S. Cl. ........................... 250/310; 250/307; 250/397
[58] Field of Search ................................... 250/310, 307, 250/397, 309, 492.21, 441.11, 491.1

[56] References Cited

U.S. PATENT DOCUMENTS 3,795,809  3/1974  Takashima ............................. 250/306

(List continued on next page.)

OTHER PUBLICATIONS

Herriott et al., EBES: A Practical Electron Lithography System, *IEEE Transactions on Electron Devices*, vol. ED-22, No. 6, Jul. 1975, pp. 385–391.

(List continued on next page.)

*Primary Examiner*—Bruce C. Anderson
*Attorney, Agent, or Firm*—Allston L. Jones

[57] ABSTRACT

There is disclosed numerous embodiments of a method and apparatus for a particle scanning system and an automatic inspection system. In each of these a particle beam is directed at the surface of a substrate for scanning that substrate. Also included are a selection of detectors to detect at least one of the secondary particles, back-scattered particles and transmitted particles from the substrate. The substrate is mounted on an x-y stage to provide it with at least one degree of freedom while the substrate is being scanned by the/particle beam. The substrate is also subjected to an electric field on it's surface to accelerate the secondary particles. The system also has the capability to accurately measure the position of the substrate with respect to the charged particle beam. Additionally, there is an optical alignment means for initially aligning the substrate beneath the,particle beam means. To function most efficiently there is also a vacuum means for evacuating and repressurizing a chamber containing the substrate. The vacuum means can be used to hold one substrate at vacuum while a second one is (Abstract continued on next page.)

being loaded/unloaded, evacuated or repressurized. Alternately, the vacuum means can simultaneously evacuate a plurality of substrates prior to inspection and repressurize of the same plurality of substrates following inspection. In the inspection configuration, there is also a comparison means for comparing the pattern on the substrate with a second pattern.

35 Claims, 10 Drawing Sheets

U.S. PATENT DOCUMENTS

| | | | |
|---|---|---|---|
| 3,809,899 | 5/1974 | Baker et al. | 250/423 F |
| 4,247,203 | 1/1981 | Levy et al. | 356/398 |
| 4,362,942 | 12/1982 | Yasuda | 250/398 |
| 4,438,332 | 3/1984 | Lichtenegger | 250/397 |
| 4,503,329 | 3/1985 | Yamaguchi et al. | 250/309 |
| 4,508,968 | 4/1985 | Kobayashi et al. | 250/441.11 |
| 4,609,809 | 9/1986 | Yamaguchi et al. | 250/492.21 |
| 4,618,938 | 10/1986 | Sandland et al. | 364/552 |
| 4,644,172 | 2/1987 | Sandland et al. | 250/548 |
| 4,658,138 | 4/1987 | Koike et al. | 250/310 |
| 4,665,315 | 5/1987 | Bacchetti et al. | 250/492.1 |
| 4,714,833 | 12/1987 | Rose et al. | 250/397 |
| 4,769,543 | 9/1988 | Plies | 250/310 |
| 4,805,123 | 2/1989 | Specht et al. | 364/559 |
| 4,812,651 | 3/1989 | Feuerbaum | 250/310 |
| 4,814,615 | 3/1989 | Fushimi et al. | 250/397 |
| 4,818,885 | 4/1989 | Davis et al. | 250/398 |
| 4,831,266 | 5/1989 | Froslen et al. | 250/347 |
| 4,871,911 | 10/1989 | Van Gorkom et al. | 250/310 |
| 4,896,036 | 1/1990 | Rose et al. | 250/310 |
| 4,924,104 | 5/1990 | Stengl et al. | 250/492.21 |
| 4,926,489 | 5/1990 | Danielson et al. | 382/8 |
| 4,933,565 | 6/1990 | Yamaguchi et al. | 250/492.21 |
| 4,939,364 | 7/1990 | Ishitani et al. | 250/309 |
| 4,954,705 | 9/1990 | Brunner et al. | 250/310 |
| 5,118,941 | 6/1992 | Larson | 250/310 |
| 5,122,663 | 6/1992 | Chang et al. | 250/310 |

OTHER PUBLICATIONS

Koshishiba et al., Pattern Inspection of X–Ray Mask Ulsing Scanning Transmission Electron Microscope, *Japan Journal of Applied Physics*, Issue 12, 1989, pp. 1765–1774.

Kato et al., Sub–Micron Pattern Inspection System Using Electron Beam, *SPIE*, vol. 632 Electron–Beam, X–Ray, Ion–Beam Techniques for Submicrometer Lithographies V (1986), pp. 203–209.

Takeuchi et al., Electron–Beam Inspection Technology for X–Ray Masks, *F. Vac. Sci. Technol. B*, vol. 6, No. 1, Jan./Feb. 1988.

Goto et al., In–Lens Deflections System with Nonequisectored–Type Multiple Electrostatic, *J. Vac. Sci. Technol.*, B1 (4), Oct.–Dec. 1983, pp. 1289–1292.

Idosawa et al., Numerical Considerations on Multipole–Type Electrostatic Deflectors, *J. Vac. Sci. Technol.*, B1 (4), Oct.–Dec. 1983, pp. 1322–1326.

W. H. J. Andersen, Optimum Adjustment and Correction of the Wien Filter, *Brit. J. Appl. Phys.*, 1967, vol. 18. Printed in Great Britain, pp. 1573–1579.

G. H. Curtis, et al., A Wien Filter for Use as an Energy Analyzer with an Electron Microscope, *The Review of Scientific Instruments*, vol. 42, No. 5, May 1971, pp. 630–637.

ELECTRON BEAM INSPECTION SYSTEM AND METHOD

REFERENCE TO PRIOR APPLICATION

This is a continuation of application Ser. No. 07/710,351, filed May 30, 1991 abandoned.

FIELD OF THE INVENTION

This invention relates to the automatic inspection of substrate of various descriptions used in the making of micro-circuits and particularly the inspection of masks used in X-Ray lithography.

BACKGROUND OF THE INVENTION

A prerequisite of micro-circuit production with a reasonable yield is defect free masks to be used in the production process. Over the past 12 years a number system have been developed, and patented for the automatic inspection of optical masks. (See U.S. Pat. Nos. 4,247,203 and 4,805,123). These systems perform a comparison between two adjacent dice on a photomask or reticle. Similarly, technology has evolved to inspect a die on a reticle against a CADS database. (See U.S. Pat. No. 4,926,487). These optical systems are, however, limited to optical masks because defects on X-Ray masks may not be apparent in the visible or ultraviolet spectra. Furthermore, optical inspection is limited in its resolution capability by the fundamental diffraction limit that of course also limits optical lithography. Even with phase shift mask techniques it is expected line widths below 0.35 microns cannot be achieved with optical lithography techniques and that X-Ray lithography will dominate for line widths smaller than that.

For the inspection of X-Ray masks it is expected that scanning electron microscopy techniques will be employed. Recently companies have experimented with using conventional electron microscopes for the inspection of X-Ray masks. While these experiments have been successful in detecting defects, conventional electron microscopes are much to slow and require highly skilled operators. These two attributes make such systems not practical for use in the semiconductor industry.

SUMMARY OF THE INVENTION

In accordance with the preferred embodiments of the present invention there is disclosed a method and apparatus for a charged particle scanning system and an automatic inspection system. In one embodiment there is an automatic system and method for the automatic inspection of a substrate that includes a charged particle beam column for delivering and scanning a charged particle beam on the surface of the substrate, a detector means for detecting at least one of the three types of charged particles emanating from the top or bottom surfaces of the substrate (namely, secondary charged particles, back-scattered charged particles and transmitted charged particles), and an x-y stage disposed to receive the substrate and to provide at least one degree of motion to the substrate while the substrate is being scanned by the particle beam.

In a second embodiment there is an automatic system and method for the automatic inspection of a substrate that includes a particle beam means for delivering and scanning a particle beam on the surface of the substrate, a field producing means for developing an electric field on the surface of the substrate to accelerate the secondary charged particles, and a detector means for detecting at least one of the three types of particles emanating from the top or bottom surfaces of said substrate namely, secondary particles, back-scattered particles and transmitted particles.

In a third embodiment there is a scanning charged particle system and method for directing charged particles at the surface of a substrate including a charged particle optical column, including means for producing crossed magnetic and electric deflection fields, for selectively directing charged particles emanating from the surface of the substrate, and detector means for detecting at least one of the three types of charged particles emanating from the top or bottom surfaces of said substrate, namely, secondary charged particles, back-scattered particles and transmitted charged particles.

In a fourth embodiment there is a scanning particle system and method for directing charged particles at the surface of a substrate including a charged particle optical column for selectively directing charged particles at the surface of the substrate, and a semiconductor detector means for detecting at least one of the three types of charged particles emanating from the top or bottom surfaces of the substrate, namely, secondary charged particles, back-scattered charged particles and transmitted charged particles.

In a fifth embodiment there is a scanning charged particle system and method for directing charged particles at the surface of a substrate including a charged particle optical column, including a field emission source, for selectively directing charged particles at the surface of the substrate, and detector means for detecting at least one of the three types of charged particles emanating from the top or bottom surfaces of said substrate, namely, secondary charged particles, back-scattered charged particles and transmitted charged particles.

In a sixth embodiment there is a scanning charged particle system and method for directing charged particles at the surface of a substrate including a charged particle optical column for selectively directing charged particles at the surface of the substrate, and detector means for detecting secondary charged particles from the top surface of the substrate and transmitted charged particles that pass through the substrate.

In a seventh embodiment there is a scanning charged particle system and method for directing charged particles at the surface of a substrate including a charged particle optical column for selectively directing charged particles at the surface of the substrate, and detector means for detecting secondary charged particles and back-scattered charged particles from the top surface of the substrate.

In an eighth embodiment there is an automatic system and method for the automatic inspection of a substrate including a charged particle beam means for delivering and scanning a charged particle beam on the surface of the substrate, detector means for detecting at least one of the three types of charged particles emanating from the top or bottom surfaces of said substrate (namely, secondary charged particles, back-scattered charged particles and transmitted charged particles), and optical alignment means for initially aligning the substrate beneath the charged particle beam means.

In a ninth embodiment there is an automatic system and method for the automatic inspection of a substrate including a charged particle beam means for delivering and scanning a charged particle beam on the surface of the substrate, detector means for detecting at least one of the three types off-charged particles emanating from the top or bottom surfaces of said substrate (namely, secondary charged particles, back-scattered charged particles and transmitted charged particles), and vacuum means for simultaneously evacuating and repressurization of one substrate while a second substrate is being inspected.

In a tenth embodiment there is an automatic system and method for the automatic inspection of a substrate, wherein the substrate has a pattern thereon, including a charged particle beam means for delivering and scanning a charged particle beam on the surface of the substrate, detector means for detecting at least one of the three types of charged particles emanating from the top or bottom surfaces of said substrate (namely, secondary charged particles, back-scattered charged particles and transmitted charged particles), and comparison means for comparing the pattern on the substrate with a second pattern.

In an eleventh embodiment there is an apparatus and method for the automatic inspection of a substrate using a charged particle beam including the steps of positioning the charged particle beam on the substrate accurately by measuring the position of the substrate, deflecting the charged particle beam to the desired position of the substrate, scanning the desired position of the surface of the substrate with the charged particle beam, and detecting at least one of the three types of charged particles emanating from the top or bottom surfaces of the substrate, namely, secondary charged particles, back-scattered charged particles and transmitted charged particles.

In a twelfth embodiment there is a scanning charged particle system and method for directing charged particles at the surface of a substrate including a charged particle optical column for selectively directing charged particles at the surface of the substrate, and detector means for detecting back-scattered charged particles from the top surface of the substrate and transmitted charged particles that pass through the substrate.

In a thirteenth embodiment there is an automatic system and method for the automatic inspection of substrates including a charged particle beam means for delivering and scanning a charged particle beam on the surface of the substrate, detector means for detecting at least one of the three types of charged particles emanating from the top or bottom surfaces of said substrate (namely, secondary charged particles, back-scattered charged particles and transmitted charged particles), and vacuum means for simultaneously evacuating a plurality of substrates prior to inspection and repressurization of the same plurality of substrates following inspection of at least one of the plurality of substrates.

DESCRIPTION OF THE PREFERRED EMBODIMENT

System Overview

The present invention provides an economically viable, automatic charged particle beam inspection system and method for the inspection of X-ray masks and similar conducting substrates in a production environment. In the following discussion an electron beam is used for illustrative purposes, however, the same techniques apply to other types of charged particle beams, therefore the scope of the present invention is not intended to be limited to only the illustrative electronic beam. While it is expected that the predominant use of the present invention will be for the inspection of X-ray, Electron Beam Proximity and stencil masks, the techniques disclosed here are applicable to the high speed electron beam imaging of any conductive material, and furthermore are useful for electron beam writing to expose photoresist material in the manufacture of masks or wafers.

The requirement of economic viability excludes present scanning electron microscopes because these devices have scanning speeds that are too slow and also require operator skills that exceed the skills of much of the available work force.

A novel feature of the present invention is its ability to not only detect various types of defects but to differentiate between them. By virtue of the present invention being able to simultaneously detect and differentiate between scattered, transmitted and secondary electrons, defects can be classified readily. As an example, a defect detected by only the transmission detector on an X-ray mask is probably a void in the absorptive material. A defect detected by the secondary electron detector but not by the back-scattered electron detector is most likely an organic particle, and a defect detected by the back-scatter electron detector is very likely a contaminant of a high atomic weight. Because some types of defects, such as organic contaminants on X-ray masks, do not print on the wafer, the ability to differentiate between various types of defects is a significant advantage of the present invention. The present invention therefore permits not only the detection of defects but the ability to classify them.

The system also employs a number of techniques to make it suitable in semiconductor manufacturing operations. To avoid contaminants being stirred up, the pump down and repressurization speeds are limited and the gas flow is kept laminar. In order to save time, these operations are done concurrently with the scanning of another sample. To further reduce unproductive time, six field emission sources are mounted on a turret. Finally, all the major adjustments of the electron beam, usually handled by an operator, are done by a computer, thereby permitting the use of the system by someone of relatively low skill level.

Figure 1:
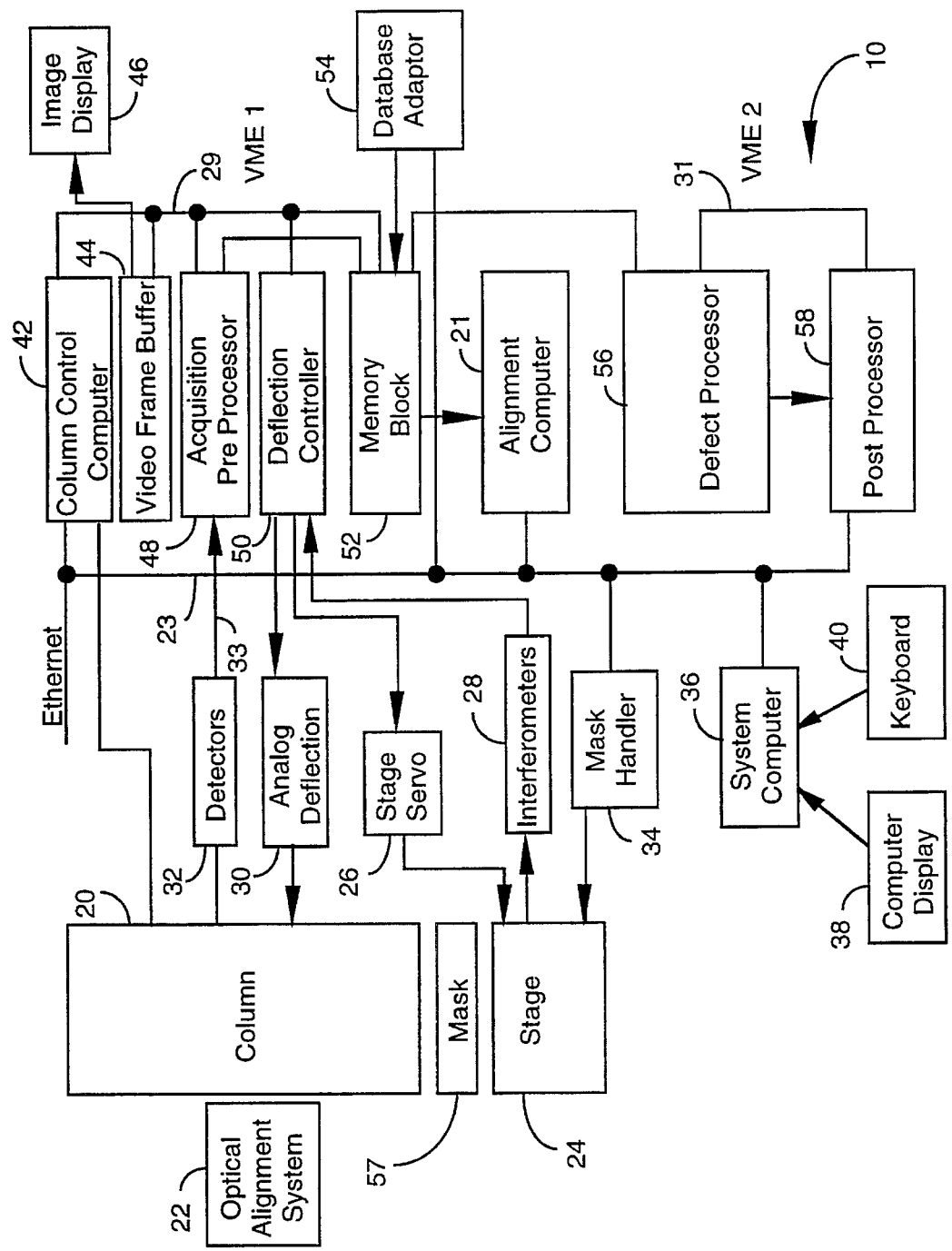
FIG. 1 is an over-all block diagram of the system of the present invention.

In FIG. 1 there is an overall block diagram of an inspection system 10 of the present invention. In system 10 an automatic inspection apparatus of X-ray masks, and other conductive substrates, is shown which uses a scanning electron microscope as its sensor.

The inspection system has two modes of operation: die-to-die and die-to-database. In both modes, defects are detected by comparing an electron beam image derived from scanning the mask against a standard. In die-to-die inspection, signals from two dice of the same mask are compared with each other, while in die-to-database inspection the signal from one die derived from the electron microscope is compared with a signal that is derived from the database which typically is the one that was used to make the die.

Mask 57 to be inspected is held in a holder which is automatically placed beneath electron beam column 20 on x-y stage 24 by mask handler 34. This is accomplished by commanding mask handler 34 by system computer 36 to remove the mask 57 of interest from a cassette with the flat 59 or notch (see FIGS. 2 and 3) on mask 57 being detected automatically to properly orient the mask 57 in handler 34. The mask is than loaded under column 20. Next, the operator visually observes the mask through optical alignment system 22 to locate the alignment points on the mask (these may be any operator selected features on the mask) to ensure that the x-directional motion of the stage is substantially parallel to the x-axis of the care area of the mask, the area of interest for the inspection. That completes the coarse alignment.

Fine alignment is subsequently achieved by the operator scanning the mask with the electron beam and observing the image on image display 46. All alignment data is then stored in alignment computer 21 which works in cooperation with system computer 36 for calculation of the actual combined x and y motions necessary to scan the die along its x and y axes so that no further operator alignment action is required for inspections of the same type of masks. Then once the mask is properly aligned, the inspection process is initiated.

Column 20 and its optical alignment system 22, analog deflection circuit 30 and detectors 32 (as described more completely below) then direct an electron beam at mask 57 and detect the secondary electrons, the back-scattered electrons and those which pass through mask 57. That operation and the data collection from that exposure is performed by column control computer 42, video frame buffer 44, acquisition pre-processor 48, deflection controller 50, memory block 52. VME bus, VME1, 29, serves as the communication link between the subsystems.

The position and movement of stage 24 during the inspection of mask 57 is controlled by stage servo 26 and interferometers 28 under the control of deflection controller 50, memory block 52 and alignment computer 21.

When the comparison mode is die-to-database, database adaptor 54 in communication with memory block 52 is used as a source of the signal that is equivalent to the expected die format.

The actual defect processing is performed on the data An memory block 52 by defect processor 56 in conjunction with post processor 58, with the communication between these blocks being via bus VME2.

The overall operation of the system is performed by system computer 36, user keyboard 40 and computer display 38 in communication with the other blocks via a data bus 23 which may be similar to an Ethernet bus. (Ethernet is a trademark of Xerox Corp.)

Figure 2:
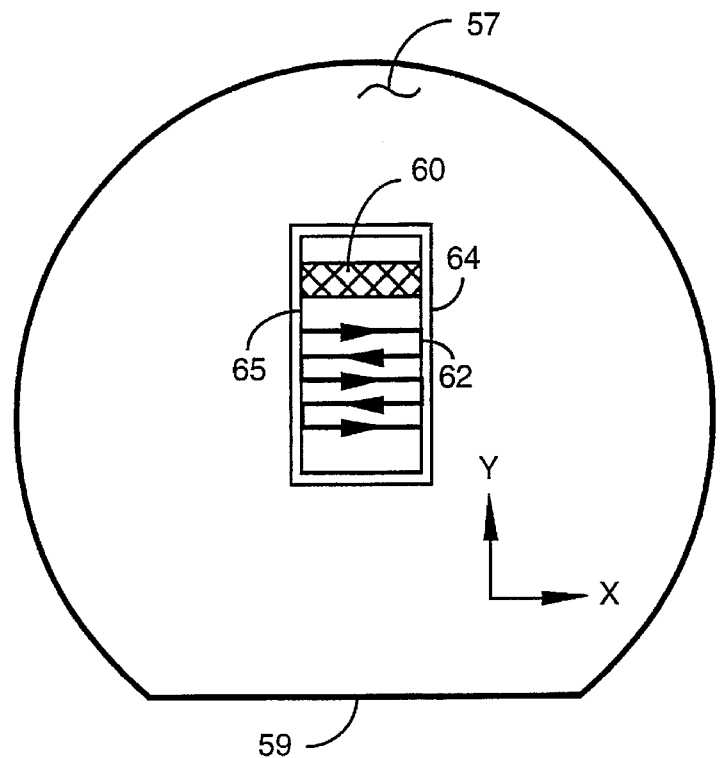
FIG. 2 is a graphical representation of the scan pattern used by the present invention for die-to-database inspection.

Next, FIG. 2 illustrates the scan pattern of the present invention for the inspection in the die-to-database mode. Here a single die 64 is shown on mask 57. Within die 64 there is a care area 65, or area of significance, that is to be inspected. This area is the area where the critical information is recorded on mask 57. During the inspection of die 64 the effective scanning motion in the x-direction is provided by moving stage 24 and the effective motion in the y-direction is provided by deflection of the electron beam within each swath which is as wide as the illustrative swath 60, then when the inspection swath reaches the right side of die 64, stage 24 is moved in the y direction less than a full swath width. Since the x-y coordinate system of mask 57 may not be aligned exactly with the x-y coordinates of stage 24 and column 20, the actual movement of stage 24 and the deflection of the beam of column 20 will each have an x and y component during the scanning of a die 64.

To fully inspect the care area 65, the inspection is performed in a back and forth pattern 62 with each of the passes illustrated by pattern 62 being a swath that slightly overlaps the adjacent swath with the swath having a width of that of illustrative swath 60.

Thus, in the die-to-database mode the signal corresponding to each swath is compared with the simulated signal derived from database adaptor 54 for a corresponding swath of a perfect die. This procedure is repeated for each of the swaths in care area 65 being inspected before the next die is inspected.

Figure 3:
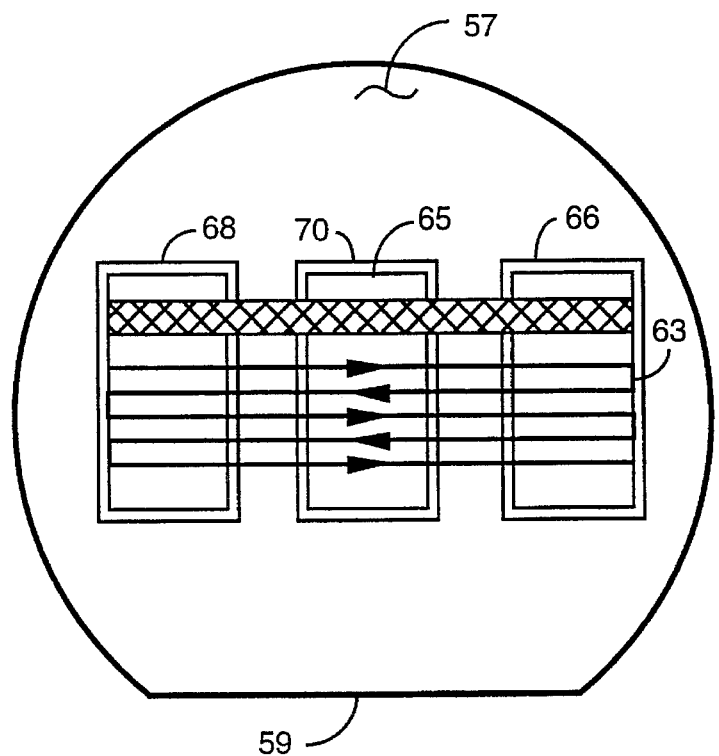
FIG. 3 is a graphical representation of the scan pattern used by the present invention for die-to-die inspection.

FIG. 3 illustrates the scan pattern for die-to-die inspection, and for purposes of illustration mask 57 is shown with dies 68, 70 and 66, in that order from left to right. In this inspection mode, similar to that shown in FIG. 2, a back and forth scan pattern 63 is used. However, since the inspection mode here is die-to-die, stage 24 is not advanced in the y direction until all three of the dice (as per this illustration) are traversed in the x direction along each of the swaths.

In this mode of comparison, the data of the first pass of die 68 is stored in memory block 52 for comparison with the data from the first pass of die 70 as it is made. At the same time that the comparison between dice 68 and 70 is being made, the data from die 70 is stored in memory block 52 for comparison with the data from the first pass of die 66. Then on the second, or return, pass the order is reversed with the data from the second pass of die 66 being stored for comparison with the data from die 70, which is then stored for comparison with the second pass of die 68. This pattern of inspection and comparison is then repeated as many times as necessary to inspect all of the care areas of mask 57.

In more detail then, using the die-to-die mode for illustration, as the electron beam scans a swath of dice 68 and 70, signals 33 from the three types of detectors are transmitted to acquisition pre-processor 48 where they are converted to digital signals for storage in memory block 52. Data from dice 68 and 70 are simultaneously transmitted to defect processor 56 where any significant discrepancy between the two data streams is then designated as a defect. The accumulation of the defect data from the defect processor 56 is then transferred and consolidated in post-processor 58. It is the post-processor that determines the size and various characteristics of the defects and makes that information available to system computer 36 via bus 23.

In the die-to-database inspection mode, system 10 operates similarly except that memory block 52 receives data from only one die and the reference data for comparison in defect processor 56 is provided by database adaptor 54.

After the entire mask has been inspected, a list of defects, together with their locations, is displayed on computer display 38, and the operator can then initiate a defect review via keyboard 40. In response to this command, system 10 locates and scans the neighborhood of each defect and displays the image to the operator on image display 46.

Scanning Optics

The much greater, by a factor of almost 100 higher, imaging speed is achieved through the combination of some key elements and the special design of column 20. The first and foremost prerequisite in achieving a higher imaging speed is a much higher beam current, since signal to noise considerations are one of the fundamental limitations in the speed of imaging. In the present invention, a high brightness thermal field emission source is used to produce a very high angular beam intensity and a very high resultant beam current. However, a high electron density results in mutual coulomb repulsion. To combat this, a high electric field is introduced in the vicinity of the cathode and the beam diameter is also quickly enlarged. In the column design there are also no electron cross-overs which would increase the charge density in that area and a large numerical aperture is employed to again minimize coulomb repulsion problems.

A requirement for scanning the mask at a high rate, such as 100 Megapixels per second, is for the detector to be able to temporally separate the secondary (return) electrons originating from two successively scanned pixels. This implies the need for a very short spread in arrival time in comparison with the dwell time on each pixel. To minimize the arrival time spread from each pixel, the electrons are accelerated soon after leaving the target. The resultant arrival time spread at the detector is consequently held to about 1 nanosecond. To further minimize the arrival time spread, reverse biased high frequency Shottkey barrier detectors, one for each type of electron to be detected, are employed (Shottkey detectors are included here for illustrative purposes, however, there are other types of semiconductor detectors that could also be used).

Electron Optics

The electron optical subsystem is functionally similar to a scanning electron microscope. It provides the scanned electron beam probe and secondary, transmission and backscattered electron detection elements necessary to form images of the mask surface. During inspection, the electron beam is scanned in one direction while the stage is moved in the perpendicular direction. Either low voltage secondary electrons, or high energy transmitted electrons or backscattered electrons are used to form a video signal that is digitized and stored in the form of long, narrow swath images. As well as being unique in its application for automated defect detection at high resolution, the novelty of this optics system lies in the combination of new and prior art technology used to obtain high speed, low noise images at the resolution necessary for inspection.

The beam is typically scanned over a field of 512 pixels (18–100 micrometer width) using a very fast 5 microseconds period sawtooth scan. The deflection is largely free of distortion and is substantially perpendicular to the surface, so that the imaging characteristics are uniform over the scan field.

Detection is highly efficient so that nearly all of the secondary electrons generated by each electron in the probe are used to form the image. The bandwidth of the detection system is comparable to the pixel rate, due to the short transit time effects. Extraction of secondary electrons is coaxial so that edge features are imaged identically regardless of their orientation upon the mask.

Figure 4:
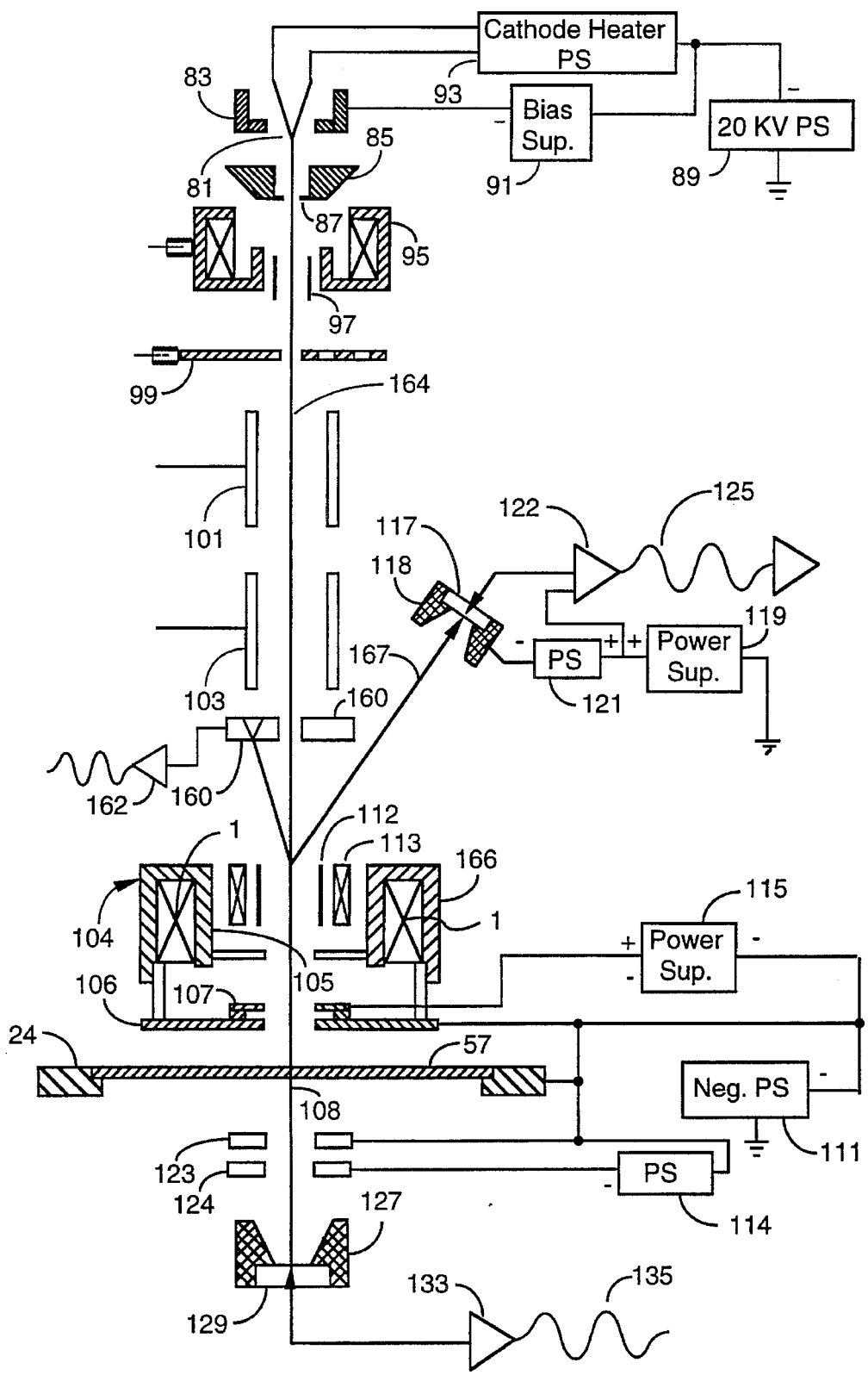
FIG. 4 is a schematic representation that shows the functional elements of the electron optical column and collection system.

FIG. 4 shows the elements of the optical subsystem and some of the associated power supplies necessary for understanding its function. The electron gun consists of a thermal field emission cathode 81, an emission control electrode 83, and an anode 85 having an anode aperture 87. Cathode 81 is held at a beam voltage of −20 KeV by power supply 89. Emission current, which depends upon the electric field strength at the surface of cathode 81, is controlled by the voltage on electrode 83 via bias supply 91, which is negative with respect to the voltage on cathode 81. Cathode 81 is heated by current supply 93. A magnetic condenser lens 95 near cathode 81 is used to collimate the electron beam. An upper deflection system 97 is used for alignment, stigmation and blanking. The optics are further apertured by beam limiting aperture 99 consisting of several holes. The beam 100 is deflected by a pair of electrostatic pre-lens deflectors 101 and 103, causing the beam to rock around a point above the objective lens 104. Objective lens 104 consists of lower pole piece 106, intermediate electrode 107 and upper pole piece 105. The beam is eventually scanned telecentrically over mask 57. The approximately parallel beam is refocussed by the objective lens 104, forming a 1 x magnified image of the source that illuminates mask 57.

In the secondary image mode, secondary electrons are extracted up through the objective lens 104. Stage 24, mask 57 and lower lens pole piece 106 are floated a few hundred volts negative by power supply 111 so that secondary electrons are accelerated to this energy before passing through deflectors 112 and 113. The intermediate electrode 107 is biased positive with respect to the stage via supply 115, and is used to accelerate the electrons as soon as they leave the mask and to aid in the efficient collection of secondary electrons that emanate from depressed areas on the substrate. This combination of a floating stage 24 and an intermediate electrode 107 virtually eliminate any spread in electron arrival times at secondary electron detector 117. As they pass back up through the len 104, the returning secondary electrons are deflected by deflectors 113 and 112 which act together as a Wien filter, and into detector 117. Here the return beam is reaccelerated to higher energy by power supply 119 in connection with anode 118 of detector 117 to cause the secondary electrons to impact the Shortkey barrier solid state detector 117 at an energy level that is sufficient for amplification. Detector diode 117 is reverse biased by power supply 121. The amplified signal from detector diode 117 then passes to preamplifier 122 after which it is transmitted to the video acquisition pre-processor 48 and associated electronics via a high voltage insulating fiber optic link 125 which is the secondary electron component of signal 33 in FIG. 1.

To allow inspection of partially transparent substrates, a transmission electron detector 129 is located below stage 24. Transmitted electrons pass through mask 57 at high energy and do not require reaccelleration. The transmission electrostatic lens (consisting of upper element 123, middle element 124 and lower element 127) is used to spread the transmitted electron beam to a diameter suitable for detection by Shottkey barrier solid state detector 129. Electrode 123 is held at the same potential as stage 24, while electrode 124 is held at 0 to −3 KV by power supply 114. The signal from transmitted electron detector 129 is amplified by amplifier 133 and transmitted by fiber optic link 135 which is the transmitted electron component of 33 in FIG. 1.

The optical system is also designed to allow the collection of back-scattered electrons which leave the substrate surface at nearly the same energy level as primary electrons. Backscattered electron detector 160 is a Shottkey barrier diode detector similar to detector 117 with the exception of a hole to allow the primary beam to pass through it. The backscattered signal is amplified by pre-amplifier 162 and also passed to pre-processor 48.

Figure 5:
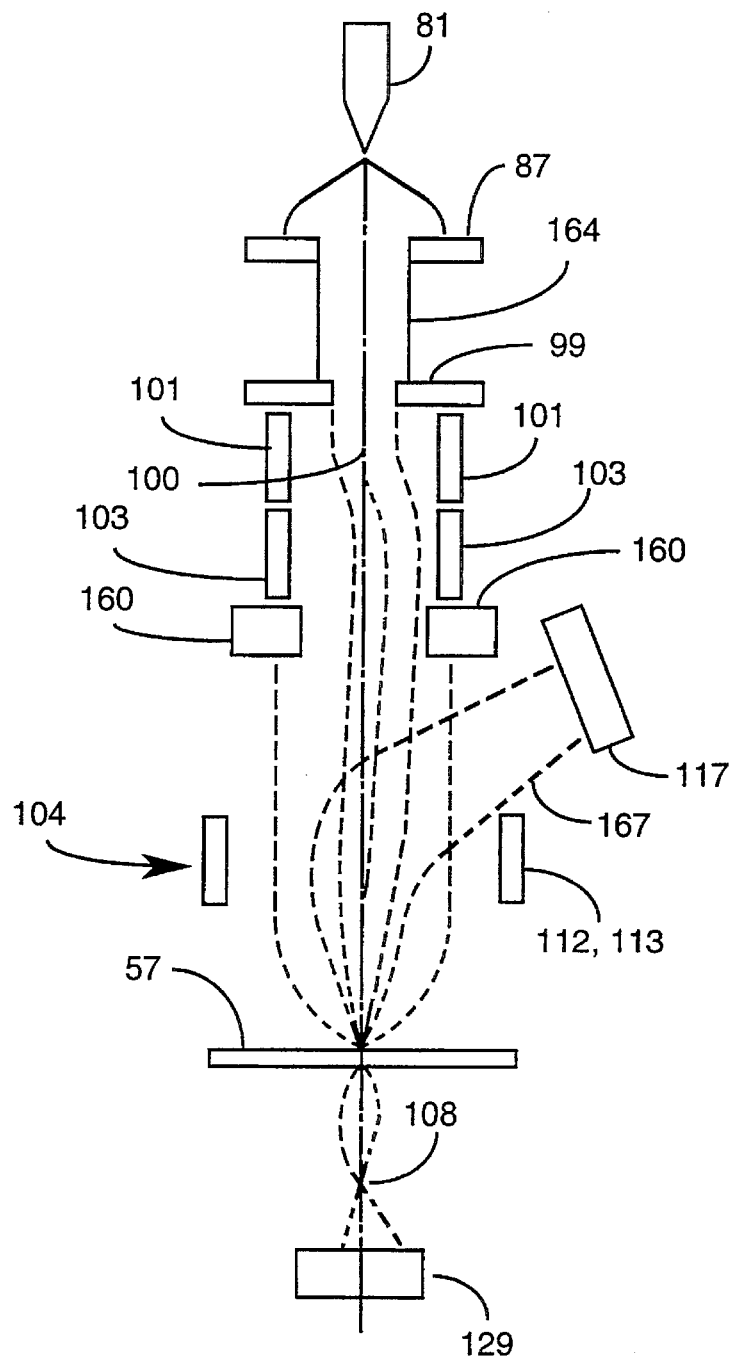
FIG. 5 is a simplified schematic representation of the paths of the primary, secondary, back-scatter and transmitted electrons through the electron optical column and collection system shown in FIG. 4.

FIG. 5 shows a schematic diagram of the various electron beam paths within column 20 and below mask 57. Electrons are emitted radially from field emission cathode 81 and appear to originate from a very small bright point source. Under the combined action of the accelerating field and condenser lens magnetic field, the beam is collimated into a parallel beam. Gun anode aperture 87 masks off electrons emitted at unusable angles, while the remaining beam continues on to beam limiting aperture 99. Upper deflector 97

(FIG. 4) is used for stigmation and alignment ensuring that the final beam is round and that it passes through the center of the objective lens consisting of elements 105, 106 and 107 (FIG. 4). Condenser lens 95 (see FIG. 4) is mechanically centered to the axis defined by cathode 81 and limiting aperture 99. The deflection follows the path shown, so that the scanned, focussed probe (beam at point of impact with the substrate) emerges from the objective lens 104.

The diameter of the scanning beam 100 and its current are determined by several factors. The angular emission from the source (1.0 mA/sterradians), and the aperture angle defined by final aperture 99 determine the beam current. The probe diameter is determined by aberrations in both lenses, which are designed for high excitation (field width/focal length) to minimize both spherical and chromatic aberration. The effect of beam interactions (i.e. statistical blurring due to repulsion between individual beam electrons) are also important in this high current system, accounting for about half the probe size on mask 57. These effects are minimized by avoiding intermediate crossovers, by using a short beam path (40 cm.) and by using lenses with relatively large half angles at the source and mask 57. To obtain a given spot size, the aperture diameter is chosen to balance all these effects while providing maximum possible current. In this system spot size is primarily adjusted using the aperture, although it is possible to change lens strengths to magnify or demagnify the beam from the source.

Wien Filter deflector 113 (see FIG. 4) deflects the approximately 100 ev secondary electron bean 167 into detector 117 without substantially influencing the higher energy scanning beam 100. The Wien filter consists of electrostatic octopole deflector 112 and quadropole magnetic deflector 113, arranged so that the electric and magnetic fields are crossed (perpendicular to each other). Returning secondary electrons are deflected sideways by both fields. However, since primary scanning electrons 100 are travelling in the opposite direction, the strength of these fields may be chosen so that the Wien filter exerts no force upon the primary scanning beam 100 even though it deflects the secondary beam 167 through a large angle. This so called "Wien filter" is used effectively for coaxial extraction. The anode 118 of secondary electron detector 117 is shaped so that during reacceleration, beam 167 is collected and refocussed upon the collector of solid state detector 117.

The paths of detected transmitted and back-scattered electrons are also shown in FIG. 5. To detect back-scattered electrons only the Wien filter 112, 113, may be turned off, so that these electrons follow the same path axially up the system to the annular back-scatter detector 160. Transmitted electrons pass through mask 57 and electrode system 123, 124 (FIG. 4) hitting transmitted electron detector 129 at high energy after being spread out to fill the surface of detector 129.

Figure 6:
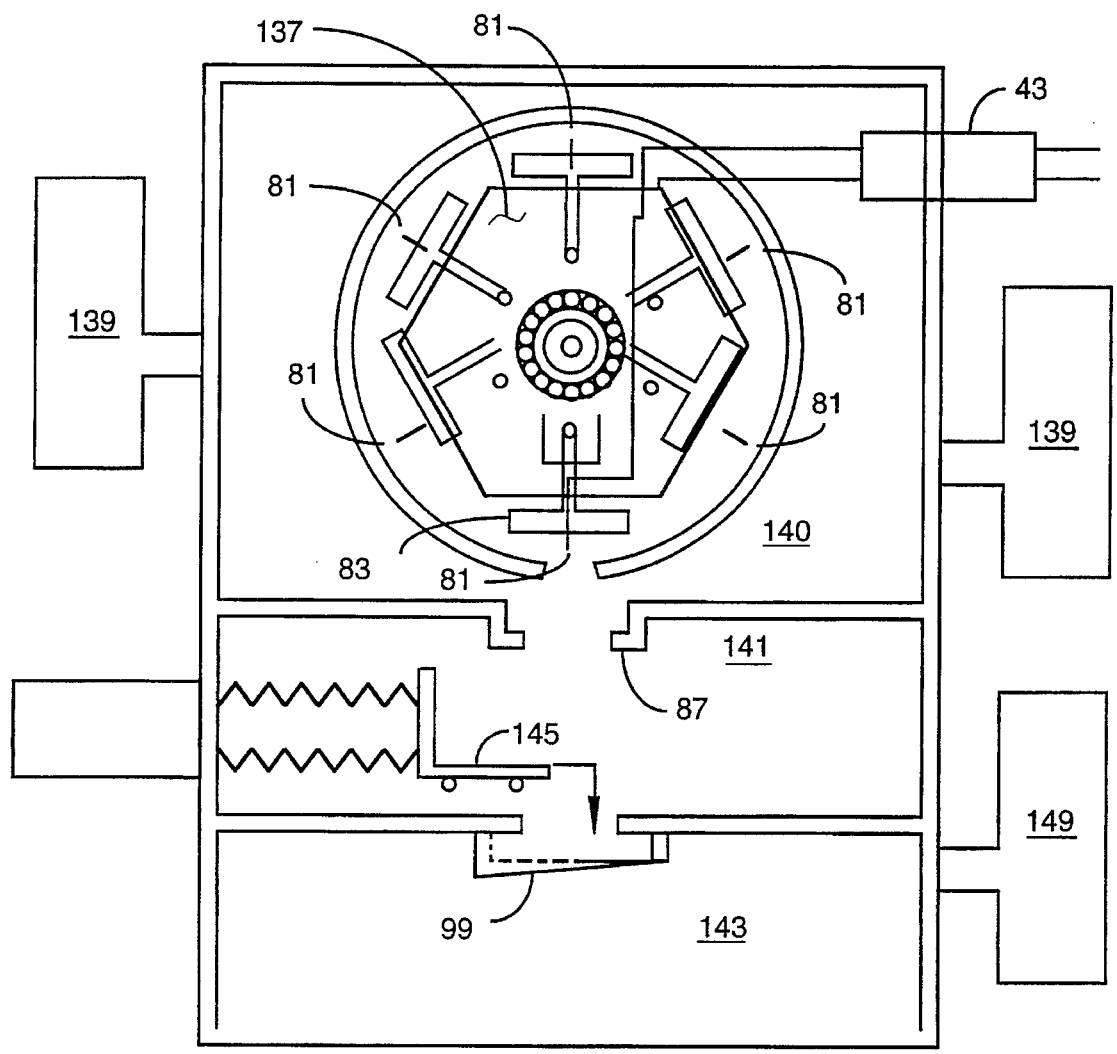
FIG. 6 is a simplified schematic representation of a multi-head electron gun and vacuum configuration.

As shown in FIG. 6, to maximize gun reliability in the face of limited cathode lifetime, the gun structure contains six cathode/control electrode assemblies mounted upon a hexagonal rotating turret 137 floating at high voltage. Each assembly may be rotated into position above anode aperture 87, and locked into position while making electrical contact with the appropriate power supplies, 91 and 93 (FIG. 4).

The electrostatic deflection system, consisting of pre-lens deflectors 101 and 103 (see FIG. 4), requires very homogeneous fields driven by high speed sawtooth deflection voltages. The structure is a monolithic ceramic/metal assembly etched to form 20 individual deflection plates. Four drivers are required for each of the two stages, to provide a scan that can be rotated to match the stage 24 and mask 57 coordinate systems.

Automatic tuning and set up are provided for operator ease. Lens and deflection/stigmation elements and all high voltage supplies are under DAC control, interfaced to column control computer 42 (see FIG. 1). In several cases, routines to adjust deflection ratios and electrostatic plate voltages for specific functions are resident in the column control computer 42, and gun control and setup is based on nominal values, modified by adaptive routines using A/D feedback for emission current, aperture current, and supply settings.

Beam centering is based upon other well known routines that eliminate deflections when lens currents are changed. These operations use specific test samples imaged by a two axis frame scan function, and they exploit image analysis capability that is also necessary for alignment and inspection. Focus is maintained automatically to compensate for mask height variations, while stigmation is performed prior to inspection. These routines are based upon analysis of the contrast and harmonic content of images using the acquisition pre-processor 48 and related electronics.

In the present invention the nominal operating conditions of the optics use a 20 keV beam energy, and beam current spot size relationship varying from 300 nA at 0.05 μm to 1000 nA at 0.2 μm. The scan period is 5 μsec using a 512 pixel scan field imaged at 100 Megapixels/sec. Detector 117 current amplification in the diode is about 1000 x at 5 KV to 5000 x at 20 keV. The overall system can perform over this range of operating conditions for samples of more than about 14% edge contrast at 100 Megapixels/sec using a 0.05 μm spot. The acquisition electronics makes provision for integrating more than one scan line, allowing lower contrast or high resolution images to be recorded at lower bandwidth.

Defect Processor

In the case of die-to-die inspection, the function of defect processor 56 is to compare image data derived from die 68 with image data derived from die 70, or, in the case of die-to-database inspection, to compare image data derived from die 64 with data derived from the database adaptor 54. The routines and the basic implementation of defect processor 56 are substantially the same as those of the defect processor described in U.S. Pat. No. 4,644,172 (Sandland et al; "Electronic Control of an Automatic Wafer Inspection System", issued Feb. 17, 1987 and assigned to the same assignee as the present application) which uses three parameters to determine defect locations whereas the present invention.

All data are received from memory block 52 for either die-to-die or die-to-database inspection and are in the form of six bits per pixel for each detector type. In defect processor 56 four parameters are determined for each pixel for each type of detector of both inputs:

a. I, the gray scale value of the pixel;
b. G, the magnitude of the gray scale pixel;
c. P, the phase of the gradient of the gray scale value; and
d. C, the curvature of the local gradient contour.

The gray scale value is merely the value in memory block for the particular pixel. The magnitude of the gradient and the direction of the gradient are derived from first computing the and y Sobel operator components:

$$S_x = \begin{bmatrix} -1 & 0 & 1 \\ -2 & 0 & 2 \\ -1 & 0 & 1 \end{bmatrix} \quad S_y = \begin{bmatrix} 1 & 2 & 1 \\ 0 & 0 & 0 \\ -1 & -2 & -1 \end{bmatrix}$$

The magnitude of the gradient is then $((S_x)^2+(S_y)^2)^{1/2}$ and the direction is $\tan^{-1}(S_y/S_x)$.

The curvature is defined as:

$$C = \begin{bmatrix} a_{11}R_{-2,-2} & a_{12}R_{-2,-1} & a_{13}R_{-2,0} & a_{14}R_{-2,1} & a_{15}R_{-2,2} \\ a_{21}R_{-1,-2} & a_{22}R_{-1,-1} & a_{23}R_{-1,0} & a_{24}R_{-1,1} & a_{25}R_{-1,2} \\ a_{31}R_{0,-2} & a_{32}R_{0,-1} & a_{33}R_{0,0} & a_{34}R_{0,1} & a_{35}R_{0,2} \\ a_{41}R_{1,-2} & a_{42}R_{1,-1} & a_{43}R_{1,0} & a_{44}R_{1,1} & a_{45}R_{1,2} \\ a_{51}R_{2,-2} & a_{52}R_{2,-1} & a_{53}R_{2,0} & a_{54}R_{2,1} & a_{55}R_{2,2} \end{bmatrix}$$

where the coefficient $a_{ij}$ is a set of parameters selected depending on the application and $R_{ij}$ is defined to be:

$$R_{ij} = \begin{bmatrix} b_{11}I_{-1,1} & b_{12}I_{-1,0} & b_{13}I_{-1,1} \\ b_{21}I_{0,1} & b_{22}I_{0,0} & b_{23}I_{0,0} \\ b_{31}I_{1,1} & b_{32}I_{1,0} & b_{33}I_{1,1} \end{bmatrix}$$

where $I_{ij}$ is the gray scale value of a pixel in the $i^{th}$ column and the $j^{th}$ row of the image and $a_{ij}$ and $b_{kl}$ are parameters derived empirically.

Typical values for the preferred embodiments are:

$$b_{ij} = \begin{bmatrix} 1 & 2 & 1 \\ 2 & 4 & 2 \\ 1 & 2 & 1 \end{bmatrix} \quad a_{ij} = \begin{bmatrix} 0 & -1 & 2 & -1 & 0 \\ -1 & 2 & -2 & 2 & -1 \\ 2 & -2 & 0 & -2 & 2 \\ -1 & 2 & -2 & 2 & -1 \\ 0 & -1 & 2 & -1 & 0 \end{bmatrix}$$

In the manner described above, quantities I, G, P and C are determined for each pixel of both images. For any given pixel A of die 68 these parameters are then compared with the same parameters of the corresponding pixel, B, on die 70 and also with the parameters of the eight pixels immediately adjacent to B. If for every pixel in the neighborhood of B at least one parameter differs from the same parameter of pixel A by a value greater than a predetermined tolerance, pixel B is flagged as a defect of both dice.

In a similar manner, the parameters of every pixel of die 70 are compared with the parameters of pixels in the corresponding neighborhood of die 68 and the appropriate pixels are flagged as being defective.

The physical implementation of this algorithm is performed in pipeline logic, as described in U.S. Pat. No. 4,644,172 (Sandland et al; "Electronic Control of an Automatic Wafer Inspection System" issued Feb. 17, 1987 and assigned to the same assignee as the present application). The matrix operations are implemented in Application Specific Integrated Circuit (ASIC) devices which are cascaded in a pipe line computational system capable of computing defect data at a rate of 100 Megapixels/second.

Deflection Controller

Figure 7:
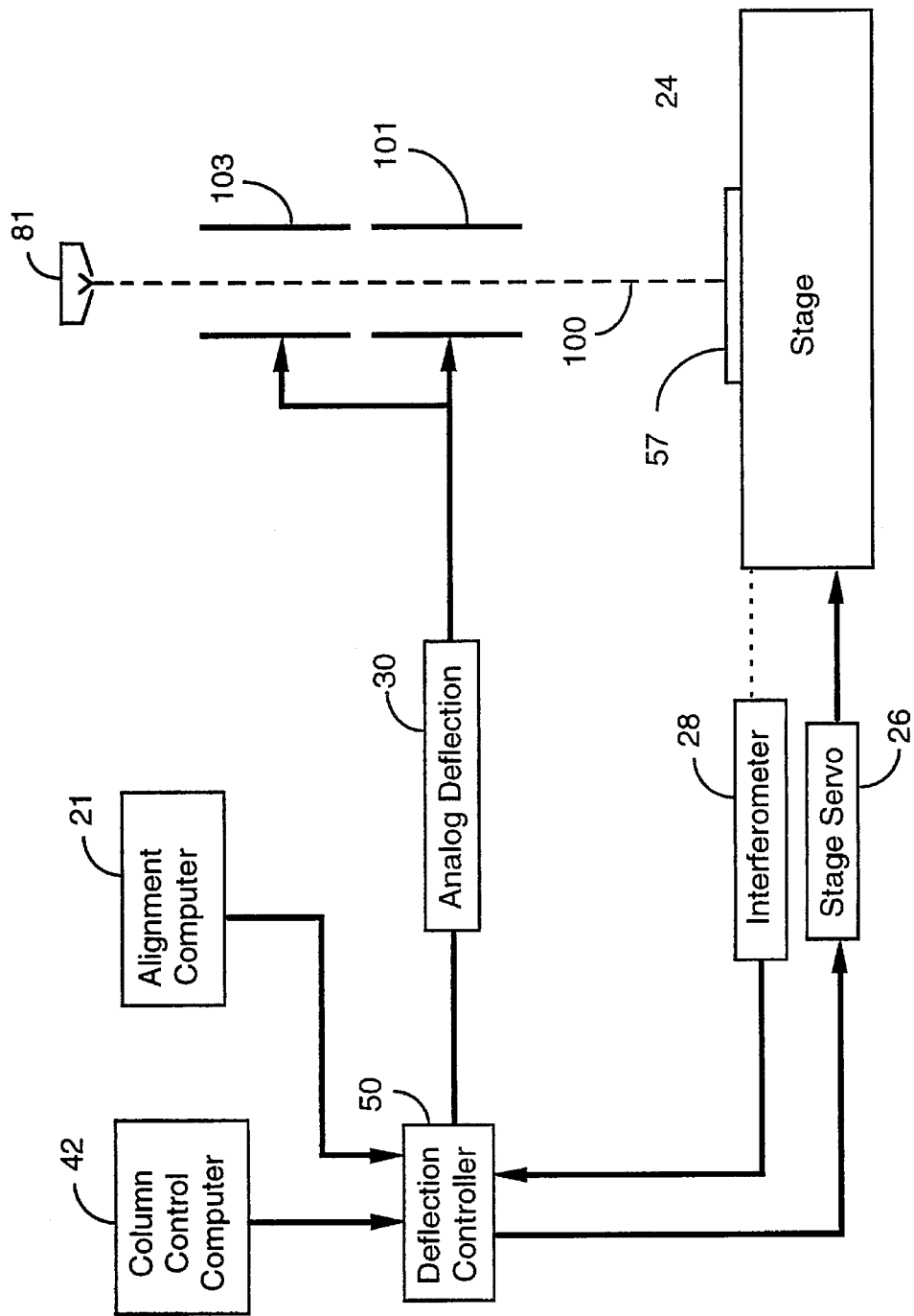
FIG. 7 is a block diagram of the positioning control subsystem of the present invention.

In die-to-die mode, the function of deflection controller 50 is to position the electron beam 100 at equidistant grid points within each swath 60 of die 68 so that the outputs of the detectors 129, 160 and 117 can be compared with the outputs of the same detectors at the corresponding location on die 70. Similarly, in die-to-database mode the simulated image derived from database adaptor 54 is compared with the detector 117 output from a die. Deflection controller 50 accomplishes this by controlling the positions of stage 24 and of electron beam 100 as shown in FIG. 7 and explained below.

When scanning the first die in a swath, the output of alignment computer 21 is set to zero, because during the scanning of the first swath of the first die there cannot be a misalignment. Therefore, during this period, deflection controller 50 receives its instruction only from column computer 42. Based on these instructions and the position data received from the x and y interferometers 28, deflection controller 50 calculates the desired motion of stage 24 and transmits corresponding signals to stage servo 26 to move stage 24 accordingly. Deflection controller 50 similarly calculates the desired deflection of beam 100 and transfers these data to analog deflection circuit 30. As stage 24 moves, its position is constantly monitored by x and y interferometers 28 and any discrepancies from the desired stage position are determined and used to generate an error signal which is fed back to the stage servo drive 26 by deflection controller 50. Because of the high inertia of stage 24, these error signals cannot correct for high frequency errors in the stage position. The high frequency errors, in both x and y, are corrected by the deflection of electron beam 100, as computed by deflection controller 50 which transmits these signals in digital form to analog deflection circuits 30.

As beam 100 scans die 68, gray scale values are stored in memory block 52. As soon as electron beam 100 starts scanning die 70 these values are also stored in memory block 52 and are immediately also transferred both to defect processor 56 and alignment computer 21. In alignment computer 21 the two data streams, one derived from die 68 and another from die 70, are compared for alignment. If there is a misalignment, an alignment correction signal is generated and transferred to deflection controller 50. This alignment signal is then used as a vernier correction to position beam 100 at the correct location on mask 57.

In die-to-database mode, deflection controller 50 functions similarly to the way it functioned in the die-to-die mode, except that the output of database adaptor 54 replaces the input image derived from the first die in the swath.

The deflection controller 50 also computes and defines the stage 24 motion, speed and direction, as well as the parameters of the electron beam deflection.

Alignment Computer

The function of alignment computer 21 is to accept two digitized images in the form of gray scale values, and determine, in terms of fractional pixel distances, the misalignment between these images. The preferred embodiment of these alignment calculations is described in U.S. Pat. No. 4,805,123 (Specht et "Automatic Photomask and Reticle Inspection Method and Apparatus Including Improved Defect Detector and Alignment Sub-System", issued Feb. 14, 1989 and assigned to the same assignee as the present application). In this preferred embodiment the alignment correction signal 51 is continuously calculated throughout the entire care area. Alternately, one may select a few specific features on the mask 57, and calculate the misalignment only at these features, assuming that alignment does not change rapidly throughout the scanning process. In the latter case, a single board computer, such as the Force Computer, Inc. model CPU 30ZBE may be used to perform the alignment calculations.

Analog Deflection

Figure 9:
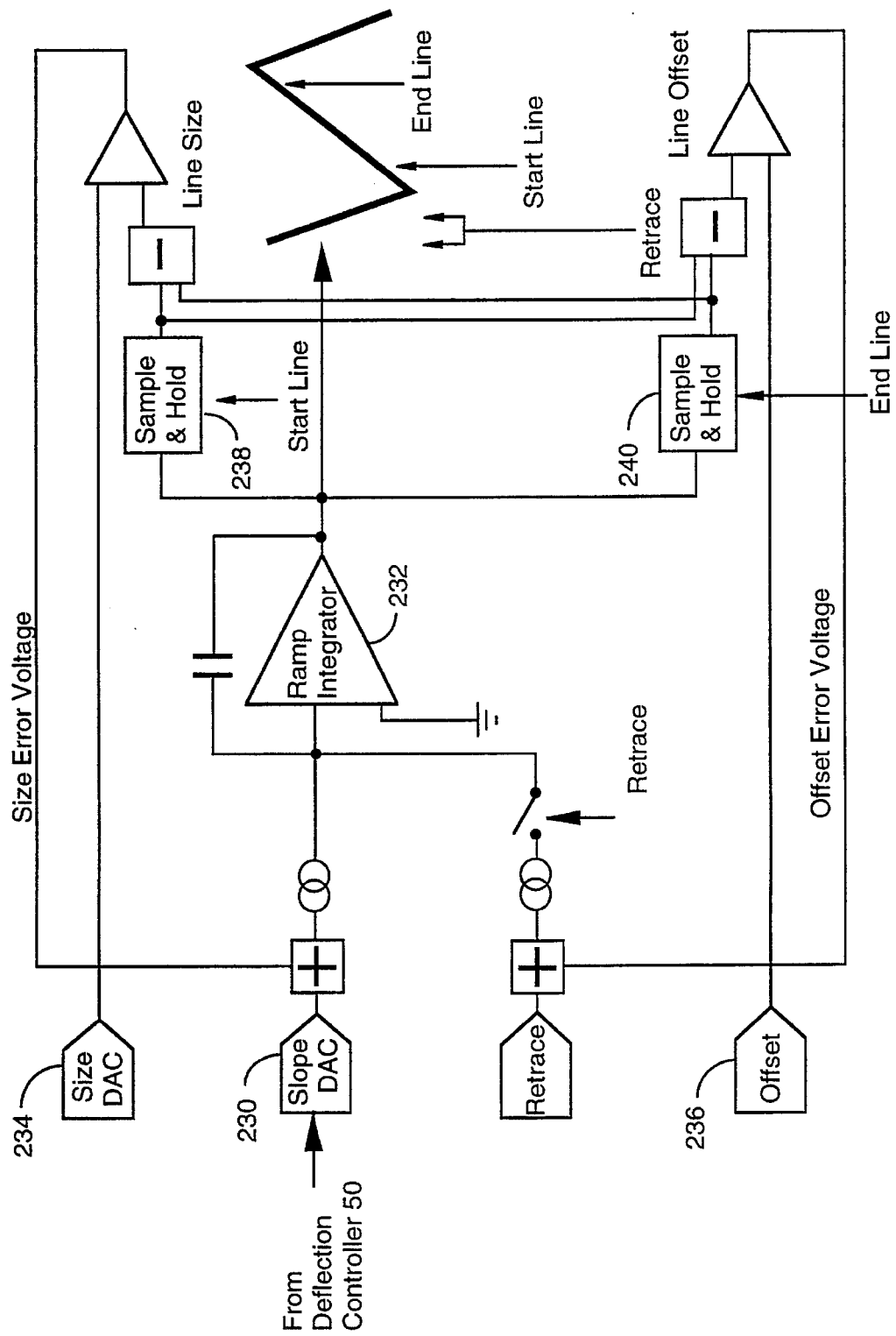
FIG. 9 is a block diagram of the analog deflection system of the present invention.

Analog deflection circuit 30 generates analog ramp functions for icosapole plates 101 and 103 (FIG. 4). The operation of this subsystem is shown in FIG. 9. The digital signal derived from deflection controller 50 is converted to an analog voltage by slope DAC 230 the output of which feeds ramp generator 232. The amplitude of the ramp is variable through the use of DAC 234, while the offset is controlled by DAC 236. Sample and hold circuits 238 and 240 are used to define the start and the end of the ramp, respectively. High voltage, low noise drivers then amplify the waveform to produce a ramp with a dynamic range of +/− 180V which is applied to deflector plates 101 and 103.

Memory Block

The Memory Block 52 consists of three identical modules, with each one corresponding to a different one of each type of detectors 117, 129 and 160.

Figure 10:
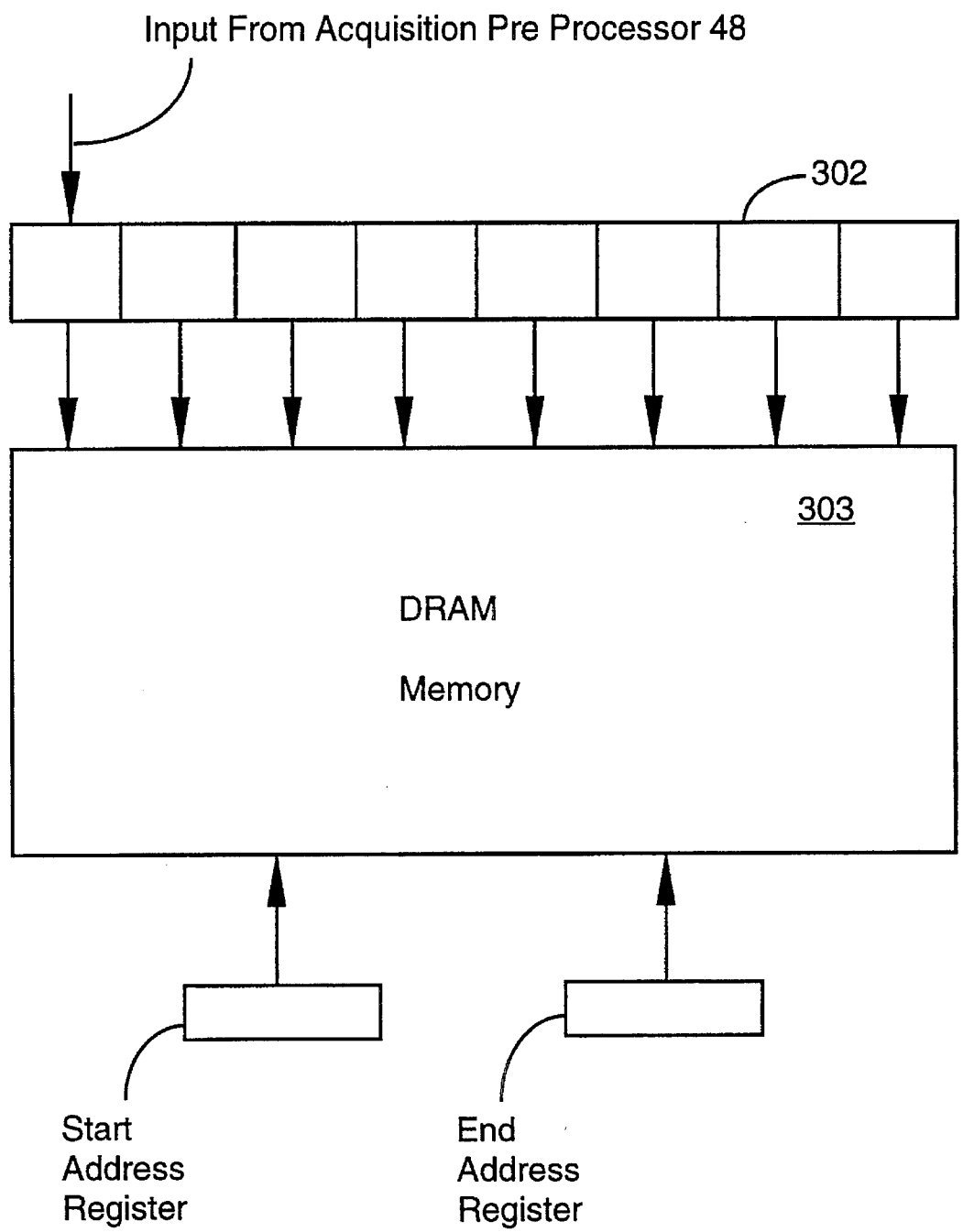
FIG. 10 is a block diagram of the memory of the present invention as shown in FIG. 1.

Referring to FIG. 10, conceptually, each module of memory block 52 consists of two FIFOs (First In—First Out) memories. The first FIFO stores the gray scale values corresponding to each detector of an entire swath derived from die 68, while the second FIFO is much shorter and stores the gray values, again for each detector, corresponding to only a few scans of die 70. The outputs from these two FIFOs are then transmitted to defect processor 56 and alignment computer 21. Each FIFO functions at a rate of 100 MHz and stores each pixel's gray scale value with a precision of 8 bits per detector.

The memory accepts, in its input register 302, 8 bytes in parallel from acquisition pre-processor 48 for each type of detector. Input register 302, acting like a shift register, shifts the eight bytes to the right and then accepts another eight bytes, until such time that the eight sections of the input register a full. At that time all 64 bytes are clocked into the memory 303.

One way to implement this is with DRAMs 303. Ordinarily 128 megabytes would be used in a system.

Acquisition Pre-Processor

Acquisition pre-processor 48 converts the analog signal from each detector 117, 160 and 129 and digitizes these to an eight bit value at a rate of 100 MHz, then reformats the output signal for storage in memory block 52.

Figure 11:
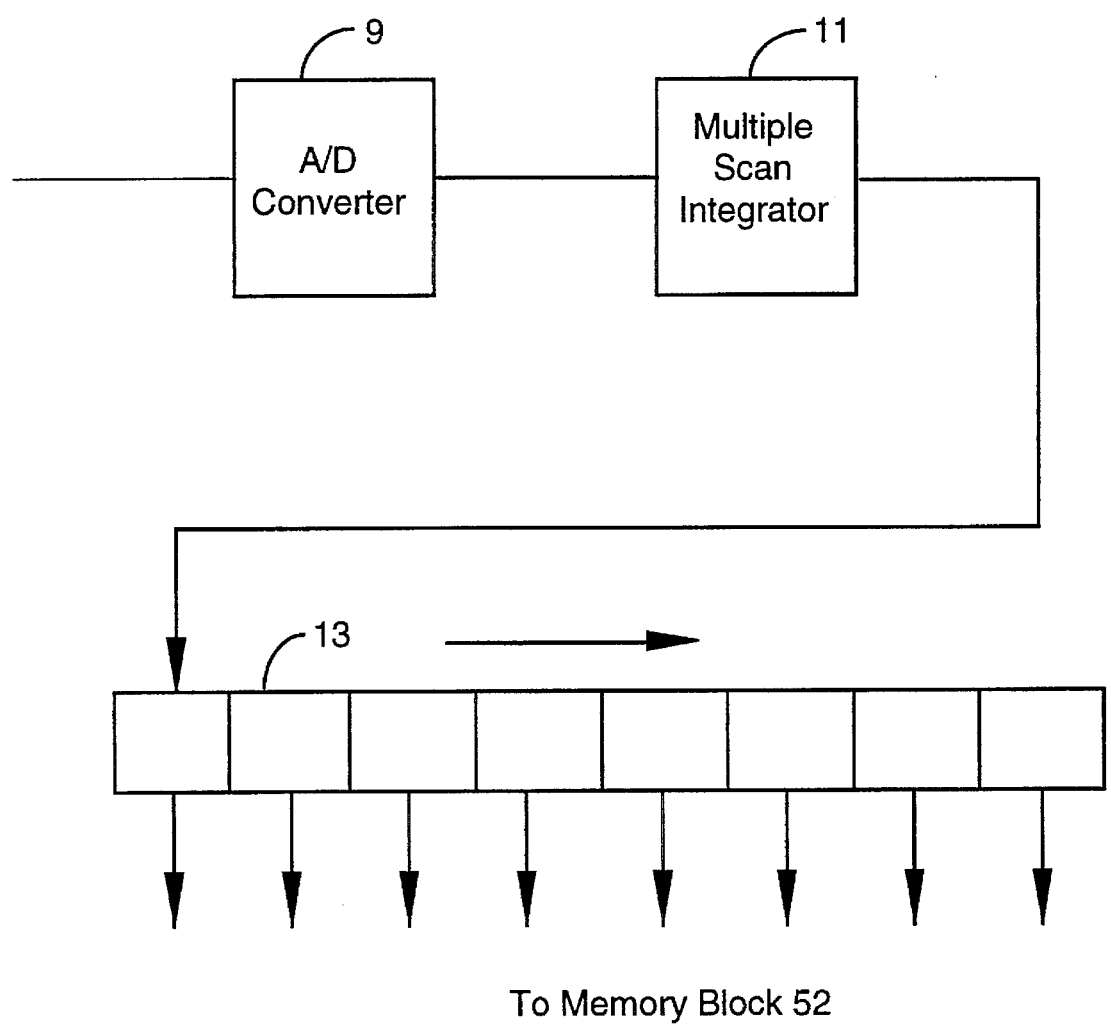
FIG. 11 is a block diagram of the acquisition preprocessor of the present invention.

Acquisition pre-processor 48 consists of three identical modules, one of which is shown in FIG. 11. Each module accepts an output from its corresponding detector and digitizes that output to an accuracy of 8 bits (ADC9) and then places it into multiple scan integrator 11. The purpose of multiple scan integrator 11 is to average the gray scale values from the same pixel for the reduction of noise. Under certain circumstances the pixel may be rescanned, i.e. resampled several times and the resultant value is the average of the values for that pixel. This value is then transferred to shift register 13 which accepts eight bytes in series before transferring them in parallel to memory block 52.

Interferometers

The x and y positions of stage 24 are monitored by x and y interferometers 28, such as Teletrac TIPS V. The positions are defined to 28-bit precision where the least significant bit corresponds to approximately 2.5 nanometers.

System Computer

Overall control of system 10 is provided by a system computer 36 which, among it's other housekeeping tasks, ensures that various step sequences are performed in an orderly manner. Each event in the sequence is accomplished at the programmed time, with a number of nonconflicting sequences performed simultaneously to maximize throughput of computer 36.

The routines preformed by computer 36 are designed such that user interaction with the system is either through keyboard 40 with an associated mouse or trackball pointing device, or by data communication with a remote computer. For local interaction, computer display 38 displays graphics and text from system computer 36.

The system computer 36 routines are organized into four communicating "tasks". These are:

1. A Master Task through which passes all communication with column control computer 42, post processor 58, and mask handler 34. This task also maintains files on the system computer that record machine operating parameters such as lens settings, vacuum pressures, and beam currents.
2. A User Interface Task that manages displays on computer display 38 and that handles keyboard 40 and mouse input. This task responds to user keyboard 40 and mouse input by modifying data files and by sending messages to other parts of the system to initiate actions.
3. An Inspect Task that sends descriptions of image acquisition swaths to column control computer 42 (via the Master Task) and that receives defect description.
4. A Command Language Interpreter Task that can accept command inputs from keyboard 40. This task also manages timers that enable the automatic scheduling of repetitive operations. In addition, this task creates and updates a text logfile describing all machine operations and the time they occurred. Normally this task is only used for machine control by service engineers.

An example of a system computer is a Sun Microsystems SPARC processor that runs under a UNIX operating system. (UNIX is a registered trademark of AT&T.)

Column Control Computer

Column control computer 42 consists of the autofocus computer, vacuum control computer and deflection instruction computer. The functions and implementation of the autofocus computer is covered under the headings Autofocus System and the Vacuum System is described under the heading of Vacuum System.

Column control computer 42 receives its instructions from system computer 36.

The column computer 42 is implemented in a 68030-based single board computer, such as the CPU 30ZBE made by Force Computer, Inc.

Post Processor

Post processor 58 receives, from defect detector 56, a map that identifies every defective pixel for each type of detector. The post processor 58 concatenates these maps to determine the size and location of each defect and classifies these by defect type. These data are then made available to system computer 36. Physically, post processor can be implemented as a 68030 single board computer, such as model CPU 30ZBE made by Force Computer, Inc.

Video Frame Buffer

Video frame buffer 44 is a commercially available video frame memory with a storage capacity of 480×512 pixels, at 12 bits per pixel. A suitable frame buffer is the Image Technology, Inc. model FG100V. The video frame buffer refreshes image display 46 30 times a second.

Image Display

Image display 46 is a commercially available color monitor, such as the SONY model PVM 1342Q. False color techniques are employed to aid the evaluation of the image by the operator. Such techniques assign different colors to the different gray shade values of a monochromatic image.

Database Adaptor

Database adaptor 54 is an image simulator that produces gray scale values corresponding to each pixel on the basis of computer aided design data used for the making of the pattern in the die. Typically, the input to the database adaptor is a digital magnetic tape in a format used for the generation of the pattern for the integrated circuit. These digital data are then converted to a stream of pixel data organized in swaths, in the same format as the output of acquisition pre-processor 48. Such a database adaptor was previously disclosed in U.S. Pat. No. 4,926,489 (Danielson et al; "Reticle Inspection System", issued May 15, 1990 and assigned to the same assignee as the present application).

Mask Handler

Figure 8:
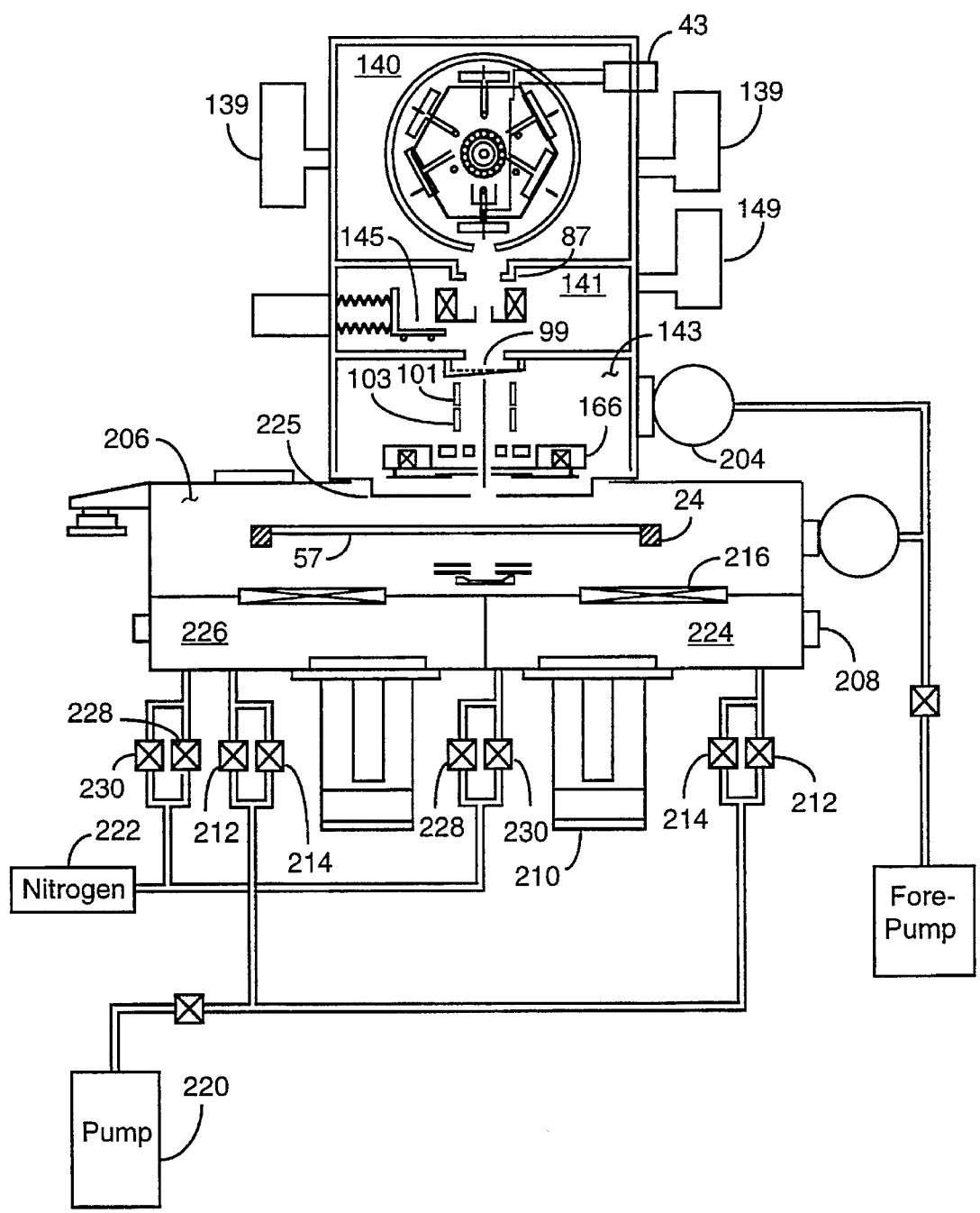
FIG. 8 is a schematic representation of the vacuum system of the present invention.

The function of mask handler 34 is to automatically extract mask 57 from the cassette and place it in the mask holder in the proper orientation. It is a robotics device that is similar to wafer handlers in common use for transporting and manipulating wafers in the semiconductor industry. The first function of the mask handler is to determine the orientation of the flat 59 of FIGS. 2 and 3. Mask handler 34 senses the flat optically with a linear CCD sensor oriented radially with respect to the rotational center of the mask. As the mask rotates, the output 30 of the image sensor is converted to digital form and is then stored in a single board computer, such as the Force Computer, Inc. CPU 30ZBE. The computer determines the location of flat 59. The mask is then rotated into the proper orientation and automatically placed into a mask holder. The mask holder, now containing the mask, is loaded into load elevator 210 of FIG. 8. All operations of the handler are executed under the control of system computer 36.

Stage

The function of stage 24 is to move mask 57 under electron beam 100 and under optical alignment system 22. In order to minimize the complexity of the system, stage 24 has been selected to only have two degrees of freedom: x and y; it can neither rotate nor move in the direction perpendicular to the x-y plane of mask 57. In other words, the stage can only be translated in x, y or diagonal directions. Instead, rotation of the E-Beam raster is accomplished electronically, by resolving any scan into the two components of the electrostatic deflection of the beam and also moving the stage with the mechanical servos in a similar manner. Z-axis motion is not required because the objective lens has sufficient range in its variable focus to compensate for any height variations in mask.

The stage 24 is a precision device with closely controlled straightness, orthogonality and repeatability. Crossed roller bearings are employed. The stage is vacuum compatible and nonmagnetic, so as not to interfere with electron beam 100. It has an open frame, so that transmission electron beam 108 can reach detector 129 below it. The open frame is also used to place mask 57 on it from below in the loading process.

Three-phase brushless linear motors (not shown), two per axis, have been selected to drive stage 24 for best overall system performance. Suitable linear motors are the Anoline models L1 and L2 made by Anorad, Inc.

Vacuum System

The entire vacuum system is under the control of column control computer 42. Conventional pressure sensors (not shown) within various parts of the system measure the pressure and report this to column control computer 42. This computer then sequences various valves, as necessary, on start-up or during the loading or unloading of a mask. The latter routine is explained in more detail under the heading of Load Operation. Should the vacuum be inadequate for the electron beam operation, the high voltage is automatically cut off to protect source 81 from damage. This is done with pressure sensors in combination with computers 42 and 36. Simultaneously pneumatic isolation valve 145 (FIGS. 6 and 8) is also actuated to protect the ultrahigh vacuum region 140 of the column from contamination. The operation of the vacuum system is explained in detail below.

The vacuum system of the gun is a two stage differentially pumped system designed to be pre-baked and otherwise to be maintained indefinitely without servicing. Ultra High Vacuum, (approximately $10^{-9}$ Torr) region 140 is pumped by ion pumps 139 and isolated by gun anode aperture 87. Intermediate (approximately $10^{-8}$ Torr) vacuum region 141 is also ion pumped, by pump 149, and is separated from main system vacuum region 143 by pneumatic gun isolation valve 145 and by aperture assembly 99. Together these vacuum elements provide an environment suitable for field emission in a production environment.

The vacuum in lower column region 143 is maintained by turbopump 204 just as the vacuum in inspection chamber 206 is provided by turbopump 208. Inspection chamber 206 is separated from lower column region 143 by a plate which has a small hole through which the electron beam can pass. This separation of vacuum regions 206 and 143 permits high vacuum to be maintained even when the substrate to be inspected is coated with a photoresist material which typically has a significant vapor pressure.

The vacuum system has two airlocks, 224 and 226, one to load a mask 57 into inspection chamber 206 and one to unload the mask after inspection. Both chambers are each connected to the vacuum pumps via two valves, 212 and 214, and 228 and 230, in a parallel configuration. Valve 212 is for 224 slow pumping of the lock chamber while valve 214 has a large orifice and is able to handle a large volume. A similar arrangement is provided for chamber 226. The purpose of this dual arrangement is to preclude charged particles being stirred up in the evacuation process and yet minimize the time required for evacuation and repressurization of the chambers.

As will be explained in more detail below, initially, after the mask has been placed in load lock 224, only the slow valve 212 is opened, thereby ensuring that the flow rate in the chamber is sufficiently slow so as not to stir up charged particles in the lock area 224. Once the pressure in the chamber has been reduced to a level that the air flow is in the molecular region, a region where charged particles are no longer stirred up, the large valve 214 is opened in order to rapidly evacuate the remaining air in the lock. A similar two-step operation is used in the repressurization process.

Load Operation

As previously described, mask 57 is mated with an adaptor in mask handler 34 and is placed into load elevator 210. Load lock 224 is, at this time, at atmospheric pressure. Valve 212, a valve that permits only slow evacuation of the load lock 224, opens. When lock 224 has reached a pressure where the flow becomes molecular, valve 214, a high capacity valve, is opened and the remainder of the air is pumped out. Now gate valve 216 is opened and elevator 210 pushes mask 57 through valve 216, into inspection chamber 206 and places it on stage 24. After mask 57 has been inspected, the reverse process takes place and mask 57 is replaced in a cassette used to store masks.

Alternately, a cassette of masks could be loaded into the chamber in a similar way, each of the collection of masks inspected and then the entire cassette of masks removed and replaced with the next cassette of masks.

Further still, the double lock arrangement of the present invention makes it possible to be inspecting one mask in one chamber while simultaneously a second mask is either being inserted and pressurized, or depressurized and removed, using the second chamber.

Autofocus System

Electron beam 100 is focused by varying the current in the system's objective lens 104 (FIG. 4). Due to the fact that masks 57 or other substrates are not flat, and because the surface of stage 24 may not be perfectly perpendicular to the axis of column 20, the optimum focus current varies over the care area. Because this variation is slow as a function of distance in the x and y directions, it is feasible to determine the optimum focus current at a few designated points on mask 57 and for any points in between these one may interpolate the desired focus current.

As part of the set-up and initialization of the inspection process, the system measures the optimum focus current at designated points. This focus calibration process consists of positioning the beam at the designated point and then measuring the gray scale value along a straight line perpendicular to an edge of a feature on mask 57. The digitized gray scale values are then convolved with a high pass filter (not shown) for 10 differing values of focus current, for example. The best focus is then the current corresponding to the highest output from the high pass filter. In the preferred embodiment a second derivative filter is used with the following convolution coefficients as follows in this example:

−4 0 0 0 8 0 0 0 −4

For best results the output of the high pass filter should be smoothed.

The focus computer is part of column control computer 42. The focus computation is carried out in special purpose hardware consisting of a convolver integrated circuit and some DSP elements.

Optical Alignment System

Optical alignment system 22 is used by the operator to visually perform coarse alignment of the die after it enters the inspection chamber. The subsystem consists of a window into the vacuum chamber, lenses to project masks on a CCD camera, for displaying the image on display 46. The operator can chose one of two lenses, (in the present invention these were empirically determined) one with a magnification of 0.46 and the other one with a magnification of 5.8 for the viewing of the mask. In order to preclude the coating of optical surfaces with films from the mask, all lenses are located outside the vacuum.

While this invention has been described in several modes of operation and with exemplary routines and apparatus, it is contemplated that persons skilled in the art upon reading the preceding descriptions and studying the drawings will realize various alternative approaches to the implementation of the present invention. It is therefore intended that the following appended claims be interpreted as including all such alterations and modifications that fall within the true spirit and scope to the present invention and the appended claims.

What is claimed is:

1. An automatic system for the automatic inspection of a substrate comprising:

a field emission electron source to provide an electron beam;

a charged particle beam column to deliver and scan an electron beam from said field emission electron source on the surface of said substrate;

at least one charged particle detector to detect at least one of the three types of charged particles emanating from the top or bottom surfaces of said substrate, namely, secondary charged particles, back-scattered charged particles and transmitted charged particles; and a continuously moving x-y stage disposed to receive said substrate and to provide at least one degree of motion to said substrate while the substrate is being scanned by the charged particle beam.

2. An automatic system for the automatic inspection of a substrate as in claim 1 further comprising at least one electrode disposed to develop an electric field on the surface of the substrate to accelerate the secondary charged particles emanating from the top surface of the substrate.

3. An automatic system for the automatic inspection of a substrate as in claim 2 wherein:

said at least one charged particle detector includes at least two charged particle detectors to detect two of said three types of charged particles emanating from the top or bottom surface of said substrate; and said system further including at least one comparator to determine the nature of defects on said substrate and the surface features of said substrate by comparing the outputs of said at least two charged particle detectors.

4. An automatic system for the automatic inspection of a substrate as in claim 1 further comprising a charged particle deflector to selectively direct particles from the surface of said substrate to said charged particle detector.

5. An automatic system for the automatic inspection of a substrate as in claim 4 wherein said charged particle deflector produces crossed magnetic and electric deflection fields.

6. An automatic system for the automatic inspection of a substrate as in claim 4 wherein said particle optical column includes a Wien filter to deflect secondary charged particles from the surface of the substrate to said charged particle detector.

7. An automatic system for the automatic inspection of a substrate as in claim 4 wherein:

said at least one charged particle detector includes at least two charged particle detectors to detect two of said three types of charged particles emanating from the top or bottom surface of said substrate; and said system further including at least one comparator to determine the nature of defects on said substrate and the surface features of said substrate by comparing the outputs of said at least two charged particle detectors.

8. An automatic system for the automatic inspection of a substrate as in claim 1 further comprising a vacuum system including a first and a second chamber in each of which pressurization can be performed independently to permit varying of the pressurization environment, and loading or unloading, of a first substrate in one of said first and second chambers while simultaneously inspecting a second substrate in a pressurized other one of said first and second chambers.

9. An automatic system for the automatic inspection of a substrate as in claim 8 wherein said vacuum system further includes two air locks to permit the independent variation of the pressure environment of each of a first and a second substrate while simultaneously inspecting a third substrate.

10. An automatic system for the automatic inspection of a substrate as in claim 1 wherein said system further comprises a comparator to compare the pattern on said substrate with a second pattern.

11. An automatic system for the automatic inspection of substrates as in claim 1 further comprising a vacuum system including a plurality of chambers in each of which pressurization can be performed independently for simultaneously permitting the varying of the pressurization environment, loading, unloading or inspecting of up to the same plurality of substrates in a pipeline manner.

12. An automatic system for the automatic inspection of a substrate as in claim 1 wherein:

said at least one charged particle detector includes at least two charged particle detectors to detect two of said three types of charged particles emanating from the top or bottom surface of said substrate; and said system further including at least one comparator to determine the nature of defects on said substrate and the surface features of said substrate by comparing the outputs of said at least two charged particle detectors.

13. An automatic system for the automatic inspection of a substrate as in claim 1 further comprising an interferometer to determine the position of said x-y stage.

14. Am automatic system for the automatic inspection of a substrate as in claim 1 further comprising a charged particle optical column having deflection elements to produce fields to control the path of charged particles, wherein said deflection elements include a Wien filter to deflect secondary charge particles from the surface of the substrate to said charged particle detector.

15. An automatic system for the automatic inspection of a substrate comprising:
   a charged particle optical column to selectively direct charged particles at the surface of said substrate; and
   a high speed semiconductor detector to detect at least one of the three types of charged particles emanating from the top or bottom surfaces of said substrate, namely, secondary charged particles, back-scattered charged particles and transmitted charged particles in the range of 100 MHz.

16. An automatic system for the automatic inspection of a substrate comprising:
   a charged particle beam column to deliver and scan a charged particle beam on the surface of said substrate;
   a charged particle detector to detect at least one of the three types of charged particles emanating from the top or bottom surfaces of said substrate, namely, secondary charged particles, back-scattered charged particles and transmitted charged particles; and
   an optical alignment system to align said substrate beneath said charged particle beam.

17. An automatic system for the automatic inspection of a substrate as in claim 16 wherein said system further comprises a comparator to compare the pattern on said substrate with a second pattern.

18. An automatic system for the automatic inspection of a substrate as in claim 16 wherein said optical alignment system automatically aligns the substrate beneath the charged particle beam.

19. An automatic system for the automatic inspection of a substrate as in claim 16 wherein said system further comprises a comparator to compare one pattern on said substrate with a second pattern on said substrate.

20. An automatic system for the automatic inspection of a substrate as in claim 16 wherein said optical alignment system performs automatically using the image pattern of the substrate being inspected for alignment of the substrate.

21. An automatic system for the automatic inspection of a substrate as in claim 16 wherein said optical alignment system includes an interferometer to automatically align the substrate being inspected.

22. An automatic system for the automatic inspection of a substrate as in claim 16 wherein:
   said systems further includes:
      a memory in which an image of the substrate to be inspected is pre-stored; and
   said optical alignment system in communication with said memory uses said stored image to automatically align the substrate being inspected.

23. An automatic system for the automatic inspection of a substrate as in claim 16 further comprising at least one electrode disposed to develop an electric field on the surface of the substrate to accelerate the secondary charged particles emanating from the top surface of the substrate.

24. An automatic system for the automatic inspection of a substrate as in claim 16 further comprising a charged particle deflector to selectively direct particles from the surface of said substrate to said charged particle detector.

25. An automatic system for the automatic inspection of a substrate as in claim 16 further comprising a vacuum system including a first and a second chamber in each of which pressurization can be performed independently to permit varying of the pressurization environment, and loading or unloading, of a first substrate in one of said first and second chambers while simultaneously inspecting a second substrate in a pressurized other one of said first and second chambers.

26. An automatic system for the automatic inspection of a substrate as in claim 25 wherein said vacuum system further includes two air locks to permit the independent variation of the pressure environment of each of a first and a second substrate while simultaneously inspecting a third substrate.

27. An automatic system for the automatic inspection of substrates as in claim 16 further comprising a vacuum system including a plurality of chambers in each of which pressurization can be performed independently for simultaneously permitting the varying of the pressurization environment, loading, unloading or inspecting of up to the same plurality of substrates in a pipeline manner.

28. An automatic system for the automatic inspection of a substrate as in claim 16 wherein:
   said at least one charged particle detector includes at least two charged particle detectors to detect two of said three types of charged particles emanating from the top or bottom surface of said substrate; and
   said system further including at least one comparator to determine the nature of defects on said substrate and the surface features of said substrate by comparing the outputs of said at least two charged particle detectors.

29. A method for the automatic inspection of a substrate using an electron beam from a field emission source, said method comprising the steps of:
   a. positioning the electron beam on the substrate accurately by measuring the position of the substrate;
   b. deflecting the electron beam to the desired position of said substrate measured in step a.;
   c. scanning the desired position of the surface of the substrate with the electron beam as said substrate is continuously moving with at least one degree of motion in an x-y plane; and
   d. detecting at least one of the three types of charged particles emanating from the top or bottom surfaces of said substrate as a result of step c., namely, secondary charged particles, back-scattered charged particles and transmitted charged particles.

30. A method for the automatic inspection of a substrate as in claim 29 wherein step a. is performed by detecting the pattern on said substrate for positioning.

31. A method for the automatic inspection of a substrate as in claim 29 wherein:
   said method further includes the step of:
      e. prestoring the desired surface characteristics of said substrate in a memory means;
   and
   step a. includes the step of:
      f. comparing the surface characteristics of said substrate with the prestored characteristics of step e. to detect the position of said substrate.

32. A method for the automatic inspection of a substrate as in claim 29 wherein step a. is performed by an interferometer.

33. An automatic system for the automatic inspection of a substrate comprising:
   field emission electron source to provide an electron beam;
   charged particle beam column to deliver and scan an electron beam from said field emission electron source on the surface of said substrate;
   a charged particle detector to detect at least one of the three types of charged particles emanating from the top or bottom surfaces of said substrate, namely, secondary charged particles, back-scattered charged particles and transmitted charged particles;

an interferometer to determine the position of said substrate with respect to said charged particle beam; and a stage disposed to receive said substrate and to provide continuous motion relative to said charged particle beam.

34. An automatic system for the automatic inspection of a substrate as in claim 33 wherein said stage includes a continuously moving x-y stage disposed to receive said substrate and to provide at least one degree of motion to said substrate while the substrate is being scanned by the charged particle beam.

35. An automatic system for the automatic inspection of a substrate using an electron beam, said system comprising:

a field emission source to provide an electron beam;

means for positioning the electron beam on the substrate accurately by measuring the position of the substrate;

means for deflecting the electron beam to the desired position of said substrate as measured by said positioning means;

means for scanning the desired position of the surface of the substrate with the electron beam;

a charged particle detector to detect at least one of the three types of charged particles emanating from the top and bottom surfaces of said substrate, namely, secondary charged particles, back-scattered charged particles and transmitted charged particles; and a continuously moving x-y stage disposed to receive said substrate and to provide at least one degree of motion to said substrate while the substrate is being scanned by the electron beam.

* * * * *